United States Patent
Otani et al.

(10) Patent No.: US 8,598,934 B2
(45) Date of Patent: Dec. 3, 2013

(54) LEVEL SHIFTER CIRCUIT AND DISPLAY DRIVER CIRCUIT

(75) Inventors: Keigo Otani, Kanagawa (JP); Ryo Takeuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 224 days.

(21) Appl. No.: 13/137,057

(22) Filed: Jul. 18, 2011

(65) Prior Publication Data

US 2012/0038611 A1 Feb. 16, 2012

(30) Foreign Application Priority Data

Aug. 16, 2010 (JP) ................................. 2010-181535

(51) Int. Cl.
*H03L 5/00* (2006.01)
(52) U.S. Cl.
USPC ............................... 327/333; 326/68; 326/80
(58) Field of Classification Search
USPC ........................ 327/333; 326/68, 80
See application file for complete search history.

(56) References Cited

U.S. PATENT DOCUMENTS

| 7,501,876 | B2 * | 3/2009 | Kimura .......................... 327/333 |
| 7,619,460 | B2 * | 11/2009 | Mei et al. ..................... 327/333 |
| 7,863,963 | B2 * | 1/2011 | Zhang et al. .................. 327/333 |
| 8,339,178 | B2 * | 12/2012 | Cheng et al. .................. 327/333 |
| 2008/0164931 | A1 | 7/2008 | Kimura |

FOREIGN PATENT DOCUMENTS

| JP | 2000-174610 A | 6/2000 |
| JP | 2008-131457 A | 6/2008 |

* cited by examiner

*Primary Examiner* — Hai L Nguyen
(74) *Attorney, Agent, or Firm* — McGinn IP Law Group, PLLC

(57) ABSTRACT

A level shifter circuit includes a first voltage conversion circuit and a second voltage conversion circuit. The first voltage conversion circuit receives an input signal having an amplitude ranging between a power supply potential (GND) and a power supply potential (VDDL), a power supply potential (VDDH) which is higher than the power supply potential (VDDL) is supplied. Further, a current limiting circuit is provided that limits a current supplied from a power supply line of the power supply potential (VDDH), and outputs a voltage signal with a larger amplitude than that of the input signal according to the input signal. The second voltage conversion circuit is supplied with the power supply potential (VDDH, and outputs an output signal with an amplitude ranging between the power supply potential GND and the power supply potential (VDDH).

20 Claims, 13 Drawing Sheets

LEVEL SHIFTER CIRCUIT AND DISPLAY DRIVER CIRCUIT

CROSS-REFERENCE TO RELATED APPLICATIONS

This application is based upon and claims the benefit of priority from Japanese patent application No. 2010-181535, filed on Aug. 16, 2010, the disclosure of which is incorporated herein in its entirety by reference.

BACKGROUND

The present invention relates to a level shifter circuit and a display driver circuit which perform conversion into an output signal having a larger amplitude than an input signal.

In recent years, in a field of display devices, various methods of display devices have been developed, such as a liquid crystal display and a display using an organic EL element. Higher image quality and more gray-scale levels are required for these display devices, thus a voltage amplitude of a scanning signal and a gray-scale signal of the display device tends to increase. Therefore, a higher voltage is required for each output unit of a row driver (scanning driver) which drives scanning lines of the display panel, and a column driver (data drivers) which drives data lines of the display panel by the gray-scale signal.

On the other hand, high-speed transfer and low EMI (Electromagnetic Interference) or the like with a small number of lines is required for various control signals and video data signals which are supplied to the row driver and the column driver from the display controller. Thus, an amplitude of these signals tends to decrease. Also inside the row driver and the column driver, a miniaturizing process is adopted in order to suppress an increase in the area of a logic circuit which processes data that increases along with higher resolution and more gray-scale levels. Therefore, a power supply voltage of these logic circuits is in a trend to decrease.

Specifically for the low driver and the column driver, a lower voltage (for example, 1.5 to 2.0 V) is required for the input unit and a higher voltage (for example, 12 to 20 V) is required for the output unit. Especially the number of level shifter circuits for driving a high withstand voltage switch of a DA (Digital-to-Analog) converter increases according to the number of outputs and gray-scale levels of the display driver circuit. Thus a reduced area, lower power consumption, and a faster operation are required for the level shifter circuit.

SUMMARY

FIG. 10 is a circuit diagram (see Japanese Unexamined Patent Application Publication No. 2000-174610) showing an example of the level shifter circuit. A level shifter circuit 111 shown in FIG. 10 includes inverter circuits INV 101, INV 102, N-channel MOS transistors (NMOS transistor) 121 and 122, and P-channel MOS transistors (PMOS transistor) 131, 132, and 134. A power supply potential VDDH is supplied to the level shifter circuit 111 from a power source line 141, and a power supply potential VDDL is supplied to the level shifter circuit 111 from a power source line 142. The power supply potential VDDH is a potential higher than the power supply potential VDDL. The power supply potential VDDH is supplied to a node X via the PMOS transistor 134.

An input signal IN is input to the inverter circuit INV 101. The inverted input signal IN is supplied to the inverter circuit INV 102 and the gate of the NMOS transistor 122. The inverted input signal IN is further inverted by the inverter circuit INV 102, and supplied to the gate of the NMOS transistor 121. That is, the input signal IN is supplied to the gate of the NMOS transistor 121, and the inverted input signal IN is supplied to the gate of the NMOS transistor 122.

When the input signal IN is high level (VDDL), the gate of the NMOS transistor 121 will be high level (VDDL), and the NMOS transistor 121 will be in ON state. Further, the gate of the NMOS transistor 122 will be low level (GND), and the NMOS transistor 122 will be in OFF state. Since the NMOS transistor 121 is in ON state, a node Y is connected to the power supply line 143 of the ground potential, and the node Y will eventually be low level (GND). When the node Y is low level (GND), the gate of the PMOS transistor 132 will also be low level (GND), and the PMOS transistor 132 will be in ON state. Then, the nodes X and Z are connected, the node Z will be high level (VDDH), and an output signal OUT will be high level (VDDH).

On the other hand, when the input signal IN changes from high level (VDDL) to low level (GND), the gate of the NMOS transistor 122 will be high level (VDDL), and the NMOS transistor 122 will be in ON state. The gate of the NMOS transistor 121 will be low level (GND), and the NMOS transistor 121 will be in OFF state. Since the NMOS transistor 122 is in ON state, the node Z is connected to the power supply line 143 of the ground potential, and the node Z will eventually be low level (GND). When the node Z is low level (GND), the gate of the PMOS transistor 131 will be low level (GND), and the PMOS transistor 131 will be in ON state. Then, the nodes X and Y are connected, the node Y will be high level (VDDH), and an output signal OUTB will be high level (VDDH).

Then, the level shifter circuit shown in FIG. 10 controls the gate potential of the PMOS transistor 134, so as to limit the current supplied to the node X. That is, the gate potential of the PMOS transistor 134 is controlled according to the change of the potential VDDH of the power supply line 141. Thus, even when the potential VDDH of the power supply line 141 is increased, the current supplied to the node X can be limited. Thus the current supplied to the node Y can be limited via the PMOS transistor 131. Accordingly, the potential by the side of the drain of the NMOS transistor 121 can be promptly reduced. Similarly, as the current supplied to the node Z can be limited via the PMOS transistor 132, the potential by the side of the drain of the NMOS transistor 122 can be promptly reduced. Therefore, in the level shifter circuit shown in FIG. 10, it is possible to suppress from reducing the operation speed and increasing a flow-through current.

FIG. 13 is a circuit diagram showing a level shifter circuit group in which n level shifter circuits 111 are connected in parallel. The level shifter circuit group shown in FIG. 13 includes n level shifter circuits 111 corresponding to the number of outputs and gray-scale levels of the display driver. Each level shifter circuit 111 is connected to the power supply line 141 of the power supply potential VDDH, and the power supply line 143 of the ground potential. Further, input signals IN(1) to IN(n) are respectively supplied to each level shifter circuit 111. Load capacitances CL(1) to CL(n) and load capacitances CLB(1) to CLB(n) are connected to each level shifter circuit 111. The load capacitances CL(1) to CL(n) and load capacitances CLB(1) to CLB(n) are the gate capacitances and wiring capacitances of a high withstand voltage MOS transistor which are connected to a subsequent stage of each level shifter circuit. Further, resistors R143(1) to R143(n−1) are wiring resistors which exist in the power supply line 143 of the ground potential between each level shifter circuit.

Japanese Unexamined Patent Application Publication No. 2008-131457 further discloses a technique regarding a level shifter circuit that can correctly operate even when the power supply voltage is unstable.

When using a high withstand voltage NMOS transistor which can withstand a high voltage (about 20 V) for the NMOS transistors 121 and 122 of the level shifter circuit 111 shown in FIG. 10, the following problem occurs.

FIG. 11 is a view for explaining the relationship between a gate-to-source voltage (Vgs) and a drain-to-source current (Ids) in the high withstand voltage NMOS transistor. As shown in FIG. 11, in a high withstand voltage NMOS transistor, the current driving capacity is small in the voltage range of the logic voltage VDDL. For example when VDDL is 1.5 V, the current driving capacity is microampere order. This is because that it is generally difficult to reduce a threshold voltage in the high withstand voltage NMOS transistor, and the current driving capacity cannot be increased when the gate-to-source voltage is low.

At this time, in order to complete the level shift operation in the level shifter circuit shown in FIG. 10, an on-resistance obtained by combining the PMOS transistors 131 and 134, which are connected in series, must be higher than the on-resistance of the NMOS transistor 121. Similarly, an on-resistance obtained by combining the PMOS transistor 132 and 134, which are connected in series, must be higher than the on-resistance of the NMOS transistor 122.

Accordingly, when the current driving capacity of the NMOS transistors 121 and 122 is small, it is necessary to increase the on-resistance of the PMOS transistors 131, 132 and 134. Therefore, as shown in the timing chart of FIG. 12, rising edges of the voltages of the output signals OUT and OUTB delays relative to the input signal IN. That is, the present inventors have found a problem that the rising edge of the output signal OUT delays at timings t1 and t3, and the rising edge of the output signal OUTB delays at timings t2 and t4.

On the other hand, the present inventors have found another problem that in order to increase the current driving capacity of the NMOS transistors 121 and 122, when the transistor size of the NMOS transistors 121 and 122 is increased (specifically, when the gate width is increased), the circuit area also increases.

An aspect of the present invention is a level shifter circuit including a first voltage conversion circuit that receives an input signal with an amplitude ranging between a first power supply potential and a second power supply potential which is higher than the first power supply potential, and output a voltage signal having an amplitude larger than that of the input signal according to the input signal, the first voltage conversion circuit including a current limiting circuit that limits a current supplied from a power supply line of a third power supply potential which is higher than the second power supply potential, and a second voltage conversion circuit that is supplied with the third power supply potential and outputs an output signal having an amplitude ranging between the first power supply potential and the third power supply potential according to the voltage signal.

In the level shifter circuit according to the present invention, the first voltage conversion circuit outputs the voltage signal having a larger amplitude than that of the input signal according to the input signal, and the second voltage conversion circuit outputs the output signal having an amplitude ranging between the first power supply potential and the third power supply potential according to the voltage signal output from the first voltage conversion circuit. At this time, the voltage signal for driving the second voltage conversion circuit, which is output from the first voltage conversion circuit, has a larger amplitude than that of the input voltage. Thus it is possible to output the output signal at a high speed without increasing the transistor size of the second voltage conversion circuit (specifically, without increasing the gate width).

The present invention can provide a level shifter circuit and a display driver circuit that have a fast response speed for the input signal without increasing the circuit size.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Hereinafter, an embodiment of the present invention is described with reference to the drawings.

Figure 1:
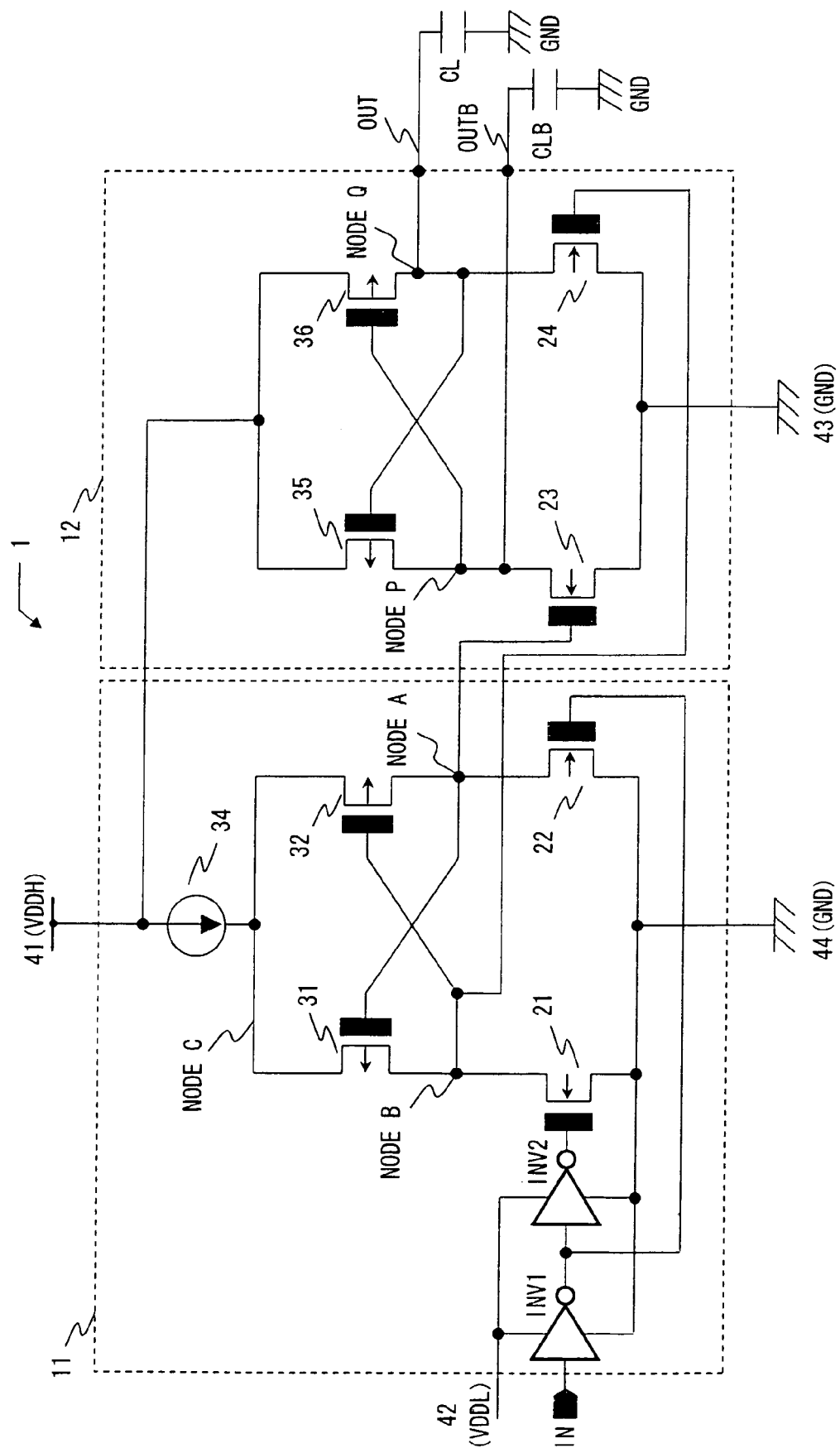
FIG. 1 is a circuit diagram showing a level shifter circuit according to a first embodiment.

FIG. 1 is a circuit diagram showing the level shifter circuit according to this embodiment. The level shifter circuit 1 according to this embodiment includes a first voltage conversion circuit 11 and a second voltage conversion circuit 12. The first voltage conversion circuit 11 receives an input signal IN having an amplitude ranging between a ground potential GND (a first power supply potential) and a power supply potential VDDL (a second power supply potential), which is higher than the ground potential GND). A power supply potential (a third power supply potential), which is larger than the power supply potential VDDL, is supplied to the first voltage conversion circuit 11. Further, the first voltage conversion circuit 11 includes a current limiting circuit 34 for limiting a current supplied from a power supply line 41 of the third power supply potential. The current limiting circuit 34 outputs a voltage signal (a voltage signal output from nodes A and B) having a larger amplitude than that of the input signal IN according to the input signal IN. The second voltage conversion circuit 12 is supplied with the power supply voltage VDDH, and outputs output signals OUT and OUTB according to the voltage signal output from the first voltage conversion circuit 11. The level shifter circuit 1 according to this embodiment is explained in detail hereinafter.

The first voltage conversion circuit 11 includes inverter circuits INV1 and INV2, an NMOS transistor 21 (a first N-channel MOS transistor), an NMOS transistor 22 (a second N-channel MOS transistor), a PMOS transistor 31 (a first P-channel MOS transistor), a PMOS transistor 32 (a second P-channel MOS transistor), and the current limiting circuit 34.

The inverter circuit INV1 receives the input signal IN, inverts the input signal IN, and outputs the inverted input signal IN to the gate of the NMOS transistor 22, and the inverter circuit INV2. The inverter circuit INV2 receives the inverted input signal IN, inverts this signal (which will be a non-inverted input signal IN) and outputs to the gate of the NMOS transistor 21. The power supply potential VDDL (the second power supply potential) is respectively supplied to the inverter circuits INV1 and INV2. Further, the inverter circuit INV1 and INV2 are connected to a power supply line 44 of the ground potential (the first power supply potential).

Note that in this embodiment, the relationship between each power supply potential is; the ground potential (the first power supply potential)<the power supply potential VDDL (the second power supply potential)<the power supply potential VDDH (the third power supply potential).

The input signal IN has an amplitude ranging between the ground potential and the power supply potential VDDL, which is higher than the ground potential.

The gate of the NMOS transistor 21 is connected to an output of the inverter circuit INV2, and supplied with the non-inverted signal of the input signal IN. Further, the source is connected to the power supply line 44 of the ground potential, and the drain is connected to the node B (the first node). The gate of the NMOS transistor 22 is connected to an output of the inverter circuit INV1, and supplied with the inverted input signal IN. The source is connected to the power supply line 44 of the ground potential, and the drain is connected to the node A (the second node).

The gate of the PMOS transistor 31 is connected to the node A, the source is connected to the power supply line 41 of the power supply potential VDDH via the current limiting circuit 34, and the drain is connected to the node B. The gate of the PMOS transistor 32 is connected to the node B, the source is connected to the power supply line 41 of the power supply potential VDDH via the current limiting circuit 34, and the drain is connected to the node A.

A node C is a node to which each source of the PMOS transistors 31 and 32 and the output of the current limiting circuit 34 are connected.

The voltage signal output from the nodes A and B is a voltage signal output according to the input signal IN, and is a voltage signal with a larger amplitude than that of the input signal IN. According to this embodiment, the voltage signal output from the nodes A and B has an amplitude ranging between the ground potential and the power supply potential VDDH.

The second voltage conversion circuit 12 includes an NMOS transistor 23 (a third N-channel MOS transistor), an NMOS transistor 24 (a fourth N-channel MOS transistor), a PMOS transistor 35 (a third P-channel MOS transistor), and a PMOS transistor 36 (a fourth P-channel MOS transistor).

The gate of the NMOS transistor 23 is connected to the node A, the source is connected to a power supply line 43 of the ground potential, and the drain is connected to a node P (a third node). The gate of the NMOS transistor 24 is connected to the node B, the source is connected to the power supply line 43 of the ground potential, and the drain is connected to a node Q (a fourth node).

The gate of the PMOS transistor 35 is connected to the node Q, the source is connected to the power supply line 41 of the power supply potential VDDH, and the drain is connected to the node P. The gate of the PMOS transistor 36 is connected to the node P, the source is connected to the power supply line 41 of the power supply potential VDDH, and the drain is connected to the node Q.

Then, in the level shifter circuit according to this embodiment, the output signals OUT and OUTB according to the input signal IN, which are the input signal IN with an amplitude amplified between the ground potential and the power supply potential VDDH, are output from the nodes Q and P. Then, the output signals OUT and OUTB which are output from the nodes Q and P are respectively supplied to the load capacitances CL and CLB. The load capacitances CL and CLB are, for example, a gate capacitance and a wiring capacitance of a high withstand voltage MOS transistor which is connected to a subsequent stage.

In the level shifter circuit 1 according to this embodiment, the NMOS transistors 21, 22, 23, and 24 and PMOS transistors 31, 32, 35, and 36 are high withstand voltage transistors which can withstand a voltage of about 20 V, for example. Moreover, the power supply potential VDDL can be about 1.5 V, and the power supply potential VDDH can be about 20 V, for example.

Figure 2:
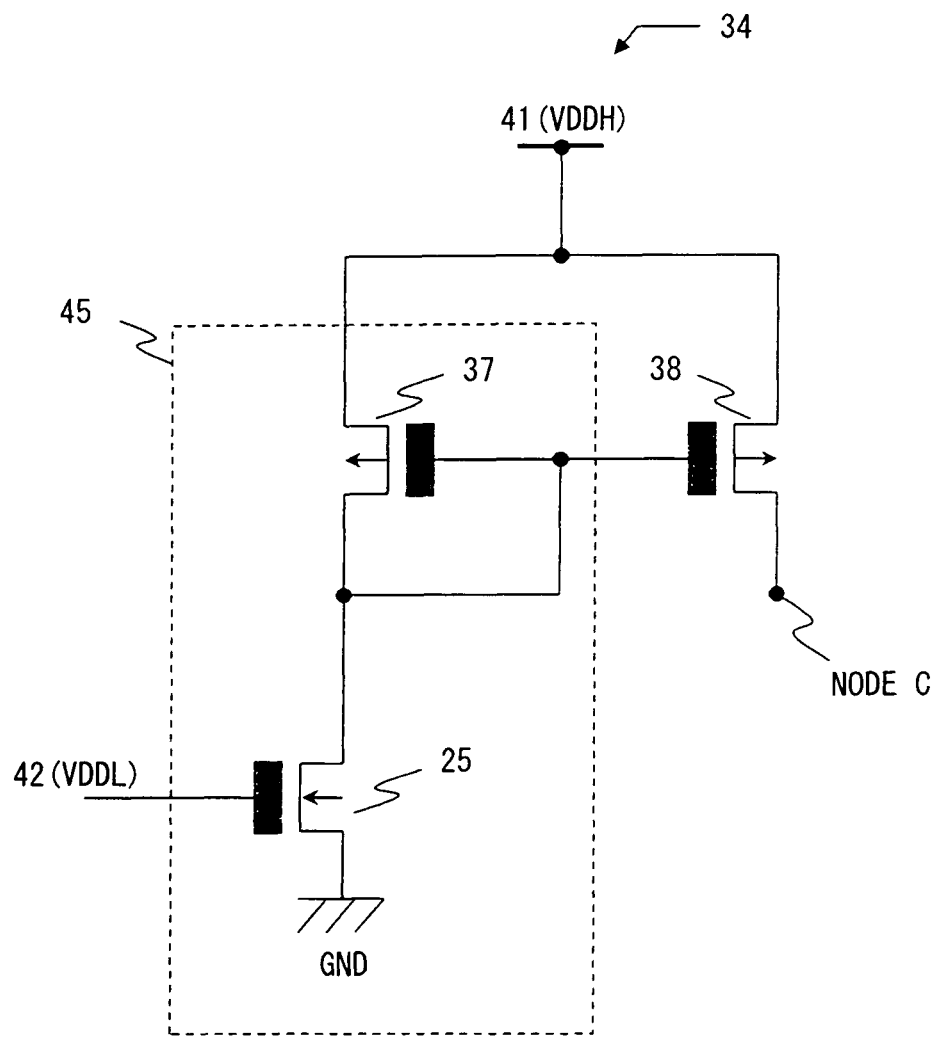
FIG. 2 is a circuit diagram showing an example of a current limiting circuit of the level shifter circuit according to the first embodiment.

FIG. 2 is a circuit diagram showing an example of the current limiting circuit included in the level shifter circuit according to this embodiment. The current limiting circuit shown in FIG. 2 includes an NMOS transistor 25 and PMOS transistors 37 and 38. The NMOS transistor 25 and the PMOS transistor 37 compose a control circuit 45 which generates a control signal for controlling a current flowing into the PMOS transistor 38.

The drain of the PMOS transistor 38 is connected to the node C (the node connected to the source of the PMOS transistors 31 and 32), the source is connected to the power supply line 41 of the power supply voltage VDDH, and the gate is connected to the gate and the drain of the PMOS transistor 37, and the drain of the NMOS transistor 25. The source of the PMOS transistor 37 is connected to the power supply line 41 of the power supply voltage VDDH. The drain of the NMOS transistor 25 is connected to the gate and the drain of the PMOS transistor 37 and the drain of the PMOS transistor 38, the gate is connected to a power supply line 42 of the power supply potential VDDL, and the source is connected to the ground potential GND.

In the current limiting circuit shown in FIG. 2, the NMOS transistor 25 is used as a constant current source, and a voltage in which the NMOS transistor 25 operates in a saturation region, for example the power supply potential VDDL, is applied to the gate. Since the amount of current flowing into the PMOS transistor 37 is limited by the NMOS transistor 25, which functions as the constant current source, when the potential level of the power supply line 41 of the power supply potential VDDH is increased, the drain potential of the PMOS transistor 37 increases. Accordingly, the gate potential of the PMOS transistor 38 also increases, and the current flowing into the PMOS transistor 38 is limited. On the other hand, when the potential level of the power supply line 41 of the power supply potential VDDH is reduced, the drain potential of the PMOS transistor 37 will decrease. Then, the gate potential of the PMOS transistor 38 decreases and the current flowing into the PMOS transistor 38 is kept constant.

Next, an operation of the level shifter circuit according to this embodiment is explained with reference to the timing chart shown in FIG. 3.

The input signal IN, which is input to the first voltage conversion circuit 11, will be high-level (VDDL) at the timing t1. Then, the gate of the NMOS transistor 21 will be high level (VDDL), and the NMOS transistor 21 will be in ON state. Further, the gate of the NMOS transistor 22 will be low level (GND), and the NMOS transistor 22 will be in OFF state.

As the node A is low level immediately before the timing t1, the PMOS transistor 31 is in ON state. Therefore, the node B is connected to the node C. Then, when the NMOS transistor 21 is in ON state, the node B is connected to the power supply line 44 of the ground potential, and the potential of the node B gradually decreases. Accordingly, the gate potential of the PMOS transistor 32 gradually decreases, and the PMOS transistor 32 gradually turns on. At this time, as the NMOS transistor 22 is in OFF state, the potential of the node A gradually increases. When the potential of the node A gradually increases, the PMOS transistor 31 gradually turns off, thus the potential of the node B decreases.

At this time, in order to complete the level shift operation, the on-resistance obtained by combining the current limiting circuit 34 (which is the PMOS transistor 38 in FIG. 2) and the PMOS transistor 31, which are connected in series, is made higher than the on-resistance of the NMOS transistor 21. Then, the node B will eventually be low level (GND). When the node B is low level (GND), the gate of the PMOS transistor 32 will also be low level (GND), and the PMOS transistor 32 will be in ON state. Thus, the node C and the node A are connected and the node A will be high level (VDDH). When the node A is high level (VDDH), the gate of the PMOS transistor 31 will also be high level (VDDH), and the PMOS transistor 31 will be in OFF state.

The node A is connected to the gate of the NMOS transistor 23 of the second voltage conversion circuit 12. Accordingly, when the node A is high level (VDDH), the NMOS transistor 23 will be in ON state. The node B is connected to the gate of the NMOS transistor 24. Accordingly, when the node B is low level (GND), the NMOS transistor 24 will be in OFF state.

As the node Q is low level immediately before the timing t1, the PMOS transistor 35 is in ON state. Therefore, the node P is connected to the power supply line 41 of the power supply potential VDDH. Then, when the NMOS transistor 23 is in ON state, the node P is connected to the power supply line 43 of the ground potential, and the potential of the node P gradually decreases. Accordingly, the gate potential of the PMOS transistor 36 gradually decreases, and the PMOS transistor 36 gradually turns on. At this time, as the NMOS transistor 24 is in OFF state, the potential of the node Q gradually increases. When the potential of the node Q gradually increases, the PMOS transistor 35 gradually turns off, thus the potential of the node P decreases.

In order to complete the level shift operation at this time, the on-resistance of the PMOS transistor 35 is made higher than the on-resistance of the NMOS transistor 23. Then, the node P will eventually be low level (GND). When the node P is low level (GND), the gate of the PMOS transistor 36 will also be low level (GND), and the PMOS transistor 36 will be in ON state. Then, the power supply potential VDDH is supplied to the node Q, and a high-level (VDDH) signal is output as the output signal OUT. On the other hand, since the node P is connected to the power supply line 43 of the ground potential and the PMOS transistor 35 is in OFF state, a low level (GND) signal is output as the output signal OUTB.

The input signal IN, which is supplied to the first voltage conversion circuit 11, will be low level (GND) from high-level (VDDL) at the timing t2. Accordingly, the gate of the NMOS transistor 22 will be high level (VDDL), and the NMOS transistor 22 will be in ON state. The gate of the NMOS transistor 21 will be low level (GND), and the NMOS transistor 21 will be in OFF state.

As the node B is low level immediately before the timing t2, the PMOS transistor 32 is in ON state. Therefore, the node A is connected to the node C. Then, when the NMOS transistor 22 is in ON state, the node A is connected to the power supply line 44 of the ground potential, and the potential of the node A gradually decreases. Then, the gate potential of the PMOS transistor 31 gradually decreases, and the PMOS transistor 31 gradually turns on. Since the NMOS transistor 21 is in OFF state at this time, the potential of the node B gradually increases. When the potential of the node B gradually increases, the PMOS transistor 32 gradually turns off, thus the potential of the node A decreases.

At this time, in order to complete the level shift operation, the on-resistance obtained by combining the current limiting circuit 34 (which is the PMOS transistor 38 in FIG. 2) and the PMOS transistor 32, which are connected in series, is made higher than the on-resistance of the NMOS transistor 22. Then, the node A will eventually be low level (GND). When the node A is low level (GND), the gate of the PMOS transistor 31 will also be low level (GND), and the PMOS transistor 31 will be in ON state. Accordingly, the nodes C and B are connected and the node B will be high level (VDDH). When the node B is high level (VDDH), the gate of the PMOS transistor 32 will also be high level (VDDH), and the PMOS transistor 32 will be in OFF state.

The node B is connected to the gate of the NMOS transistor 24 of the second voltage conversion circuit 12. Accordingly, when the node B is high level (VDDH), the NMOS transistor 24 will be in ON state. The node A is connected to the gate of the NMOS transistor 23. Accordingly, when the node A is low level (GND), the NMOS transistor 23 will be in OFF state.

As the node P is low level immediately before the timing t2, the PMOS transistor 36 is in ON state. Therefore, the node Q is connected to the power supply line 41 of the power supply potential VDDH. Then, when the NMOS transistor 24 is in ON state, the node Q is connected to the power supply line 43 of the ground potential, and the potential of the node Q will gradually decrease. Accordingly, the gate potential of the PMOS transistor 35 gradually decreases, and the PMOS transistor 35 gradually turns on. Since the NMOS transistor 23 is in OFF state at this time, the potential of the node P gradually increases. When the potential of the node P gradually increases, the PMOS transistor 36 gradually turns off, thus the potential of the node Q decreases.

In order to complete the level shift operation at this time, the on-resistance of the PMOS transistor 36 is made higher than the on-resistance of the NMOS transistor 24. Then, the node Q will eventually be low level (GND). When the node Q is low level (GND), the gate of the PMOS transistor 35 will also be low level (GND), and the PMOS transistor 35 will be in ON state. Accordingly, the power supply potential VDDH is supplied to the node P, and a high level (VDDH) signal is output as the output signal OUTB. On the other hand, since the node Q is connected to the power supply line 43 of the ground potential, and the PMOS transistor 36 is in OFF state, a low level (GND) signal is output as the output signal OUT.

Note that the operation at the timing t3 is the same as the operation at the timing t1, and the operation at the timing t4 is the same as the operation at the timing t2.

Figure 11:
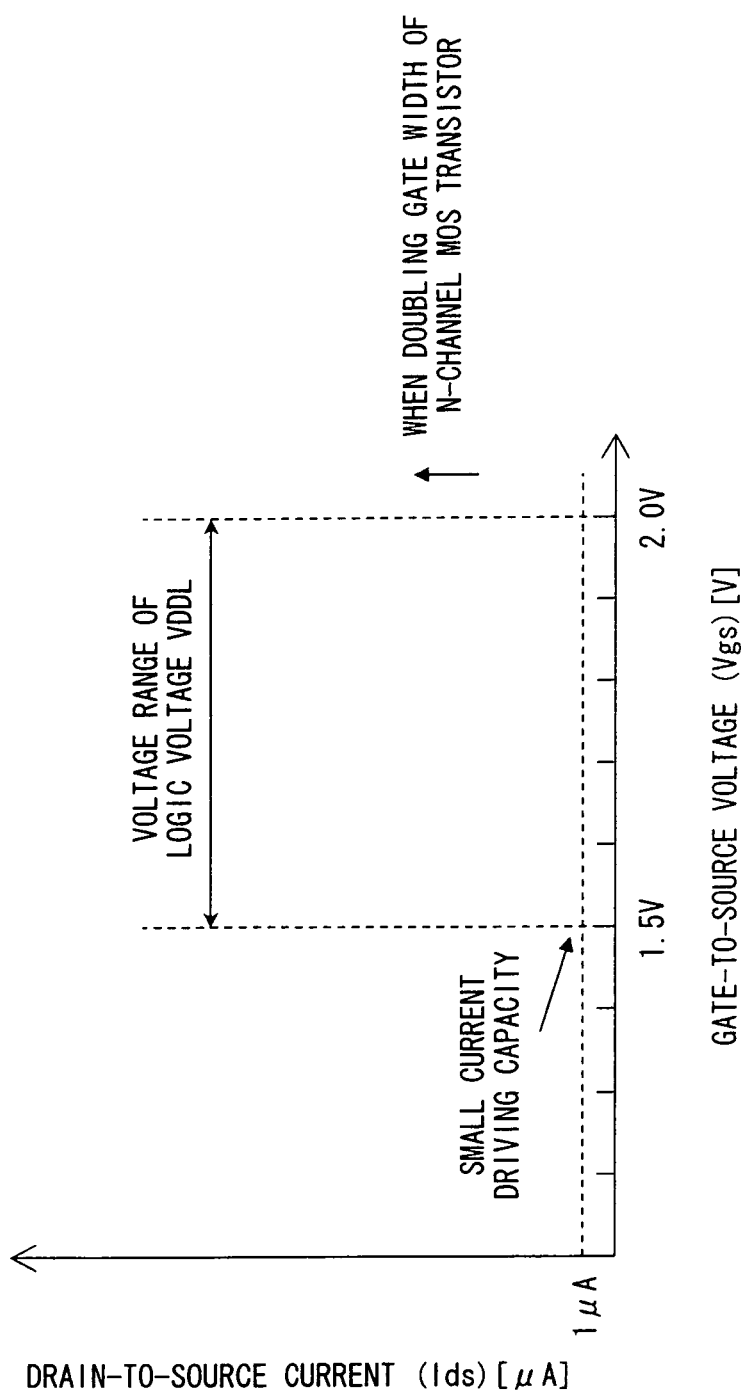
FIG. 11 is a view for explaining the problem of the present invention.
Figure 12:
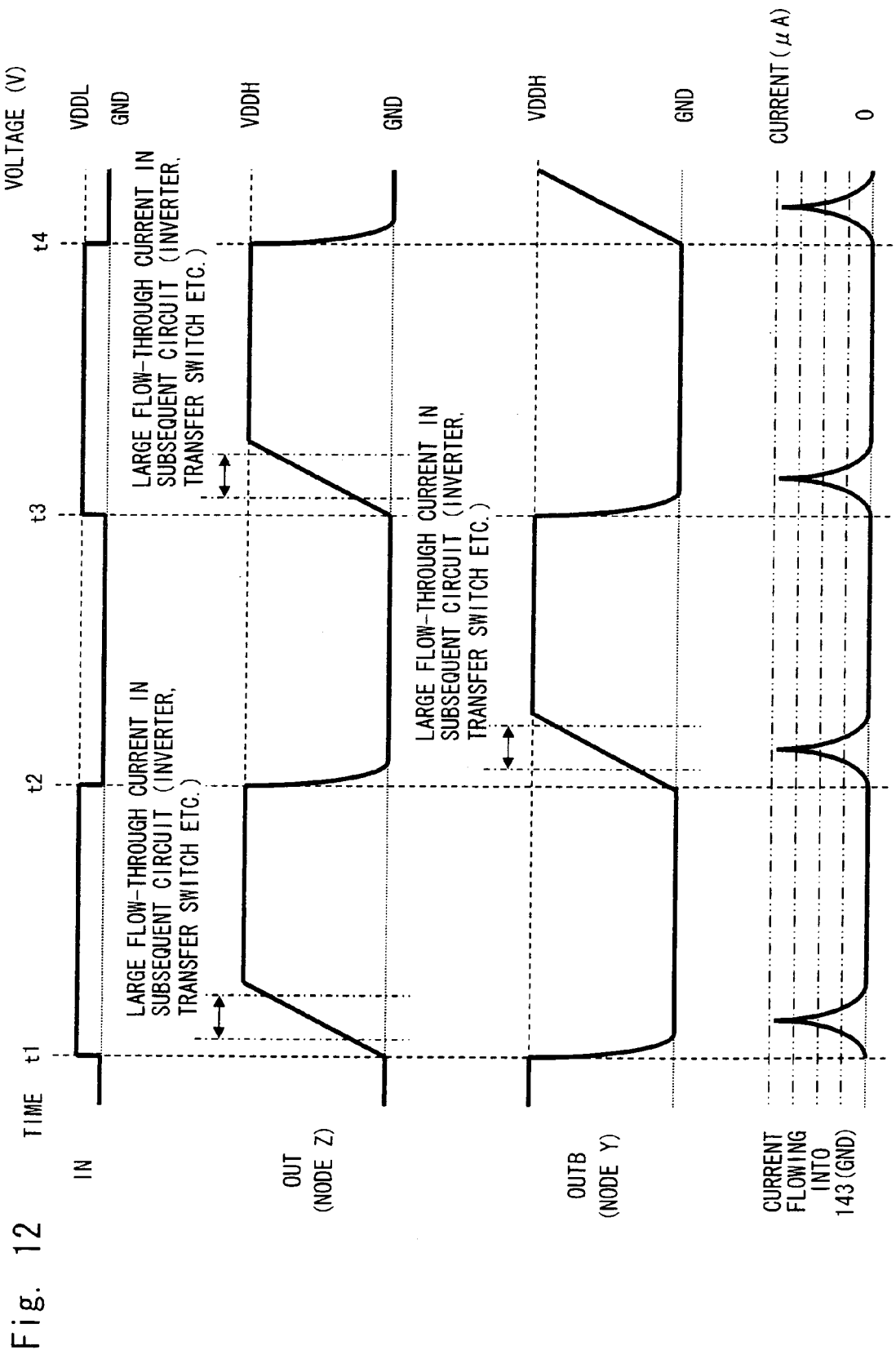
FIG. 12 is a timing chart for explaining an operation at the time of using a high withstand voltage transistor for NMOS transistors 121 and 122 of the level shifter circuit shown in FIG. 10.

In the level shifter circuit according to this embodiment, as the NMOS transistors 21 and 22 are high withstand voltage NMOS transistors, when the power supply potential VDDL is about 1.5 V, for example, the drain-to-source current (Ids) has the current driving capacity of only microampere order (see FIG. 11). This is because that it is generally difficult to reduce the threshold voltage in the high withstand voltage NMOS transistor, and the current driving capacity cannot be increased when the gate-to-source voltage is low.

As mentioned above, in order to complete the level shift operation at the timing t1, the on-resistance obtained by combining the current limiting circuit 34 (which is the PMOS transistor 38 in FIG. 2) and the PMOS transistor 31 must be higher than the on-resistance of the NMOS transistor 21. Similarly, in order to complete the level shift operation at the timing t2, the on-resistance obtained by combining the current limiting circuit 34 (which is the PMOS transistor 38 in FIG. 2) and the PMOS transistor 32 must be higher than the on-resistance of the NMOS transistor 22. Therefore, the rising edges of the voltages of the nodes A and B delay.

However, in the level shifter circuit according to this embodiment, the voltages of the nodes A and B are amplified to an amplitude ranging between the ground potential and the power supply potential VDDH by the first voltage conversion circuit 11. Therefore, the potential supplied to the gate of the NMOS transistors 23 and 24 of the second voltage conversion circuit 12 can be increased, and thereby increasing the current driving capacity of the NMOS transistors 23 and 24. As a result, the output signals OUT and OUTB can be output at a high speed for the input signal IN without increasing the transistor size of the PMOS transistors 35 and 36, and the NMOS transistors 23 and 24 of the second voltage conversion circuit 12. Accordingly, by the level shifter circuit according to this embodiment, it is possible to provide a level shifter circuit with a fast response speed for the input signal without increasing the circuit area of the level shifter circuit.

Further, when a circuit such as an inverter and a transfer switch is provided in the subsequent stage of the first voltage conversion circuit 11, a change in the voltage rising edges of the nodes A and B is slow. Thus a flow-through current keeps flowing in these circuits while the voltages of the nodes A and B change. However, in the level shifter circuit according to this embodiment, the nodes A and B of the first voltage conversion circuit 11 are respectively connected to the gate of the NMOS transistor 23 and the gate of the NMOS transistor 24 of the second voltage conversion circuit 12. Since the flow-through current is received by the gate of the NMOS transistors 23 and 24, the flow-through current will not keep flowing while the voltages of the nodes A and B change.

Figure 3:
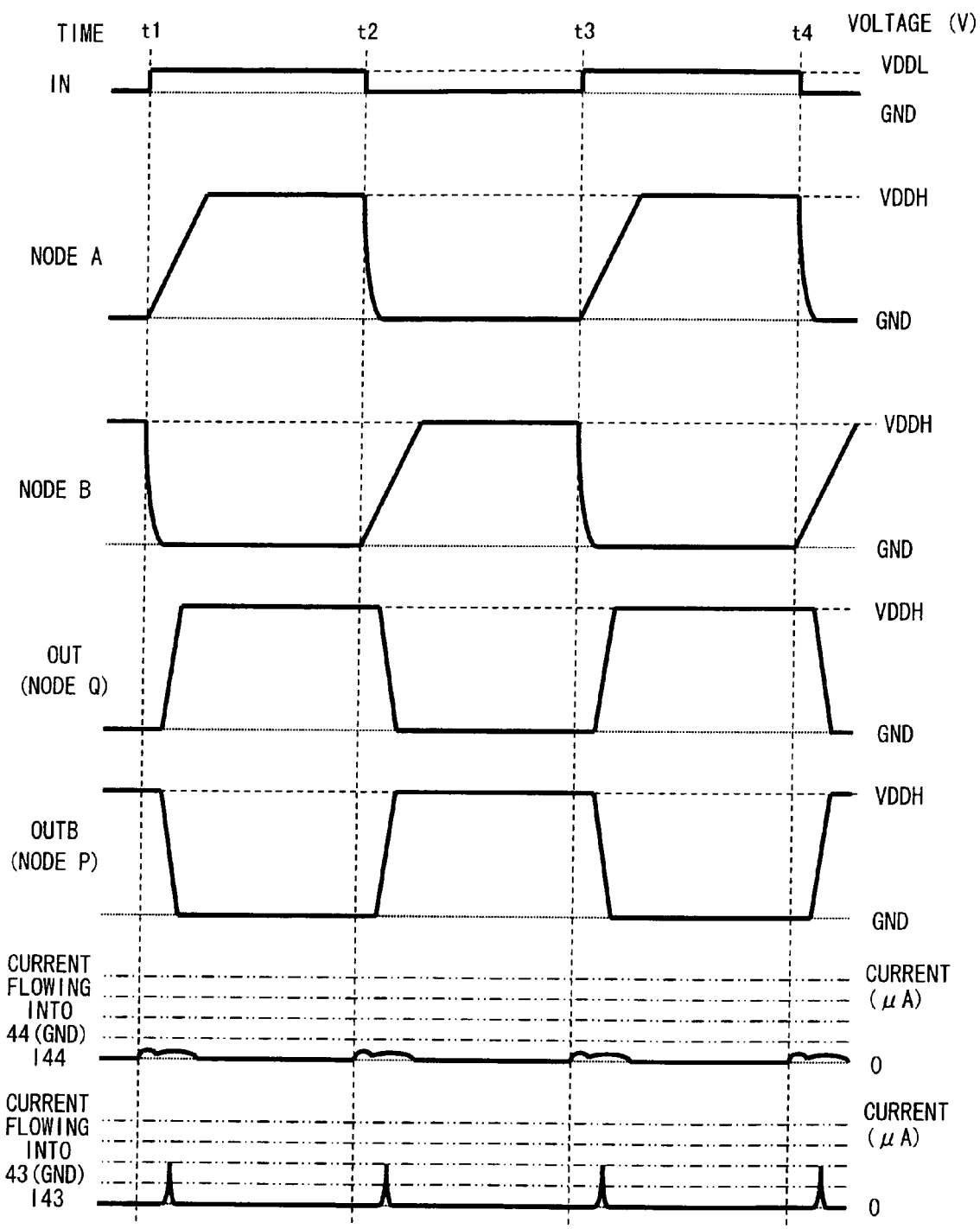
FIG. 3 is a timing chart for explaining an operation of the level shifter circuit according to the first embodiment.

In the level shifter circuit according to this embodiment, as shown in FIG. 3, the flow-through current and discharge current of the load capacitances flow into the power supply line 44 of the ground potential of the first voltage conversion circuit 11, and power supply line 43 of the ground potential of the second voltage conversion circuit 12. The flow-through current and the discharge current flowing into the power supply line 43 of the ground potential of the second voltage conversion circuit 12 is larger than the flow-through current and the discharge current flowing into the power supply line 44 of the first voltage conversion circuit 11.

Accordingly, when assuming that the power supply line 44 of the ground potential of the first voltage conversion circuit 11 and the power supply line 43 of the ground potential of the second voltage conversion circuit 12 are the same line, by the flow-through current and the discharge current of the load resistances flowing into the power supply line 43 of the ground potential of the second voltage conversion circuit 12, the voltage level of the ground potential of the first voltage conversion circuit increases. As a result, since the gate-to-source voltage (Vgs) of the NMOS transistors 21 and 22 of the first voltage conversion circuit 11 decreases, the drain-to-source current (Ids) decreases. Therefore, when the voltage of the power supply potential VDDL decreases, the level shift operation may not be performed.

Figure 13:
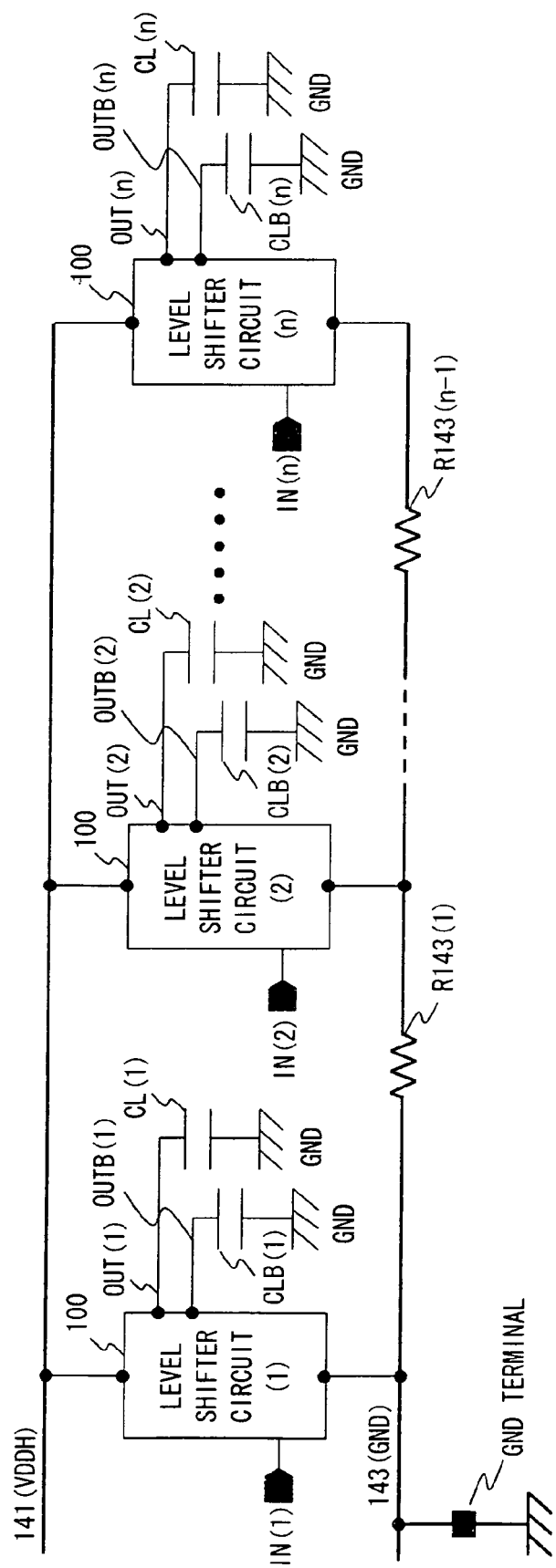
FIG. 13 is a block diagram showing a level shifter circuit group including a plurality of the level shifter circuits shown in FIG. 10.

Accordingly, in the level shifter circuit group shown in FIG. 13, n level shifter circuits simultaneously operate at a switching timing of display data according to display data. The resistors R143(1) to R143(n−1) are wiring resistors which exist in the power supply line 143 of the ground potential between each level shifter circuit. Therefore, there has been a problem that due to the discharge of the flow-through current and load current by the operation of each level shifter circuit, the voltage level of the ground potential of each level shifter circuit increases.

In the level shifter circuit according to this embodiment, in order to solve such problem, the power supply line 44 (a first line) of the ground potential of the first voltage conversion circuit 11 and the power supply line 43 (a second line) of the ground potential of the second voltage conversion circuit 12 are separated. Accordingly, by the flow-through current and the discharge current flowing into the power supply line 43 of the ground potential of the second voltage conversion circuit 12, it is possible to suppress from increasing the voltage level of the ground potential of the first voltage conversion circuit 11.

Figure 4:
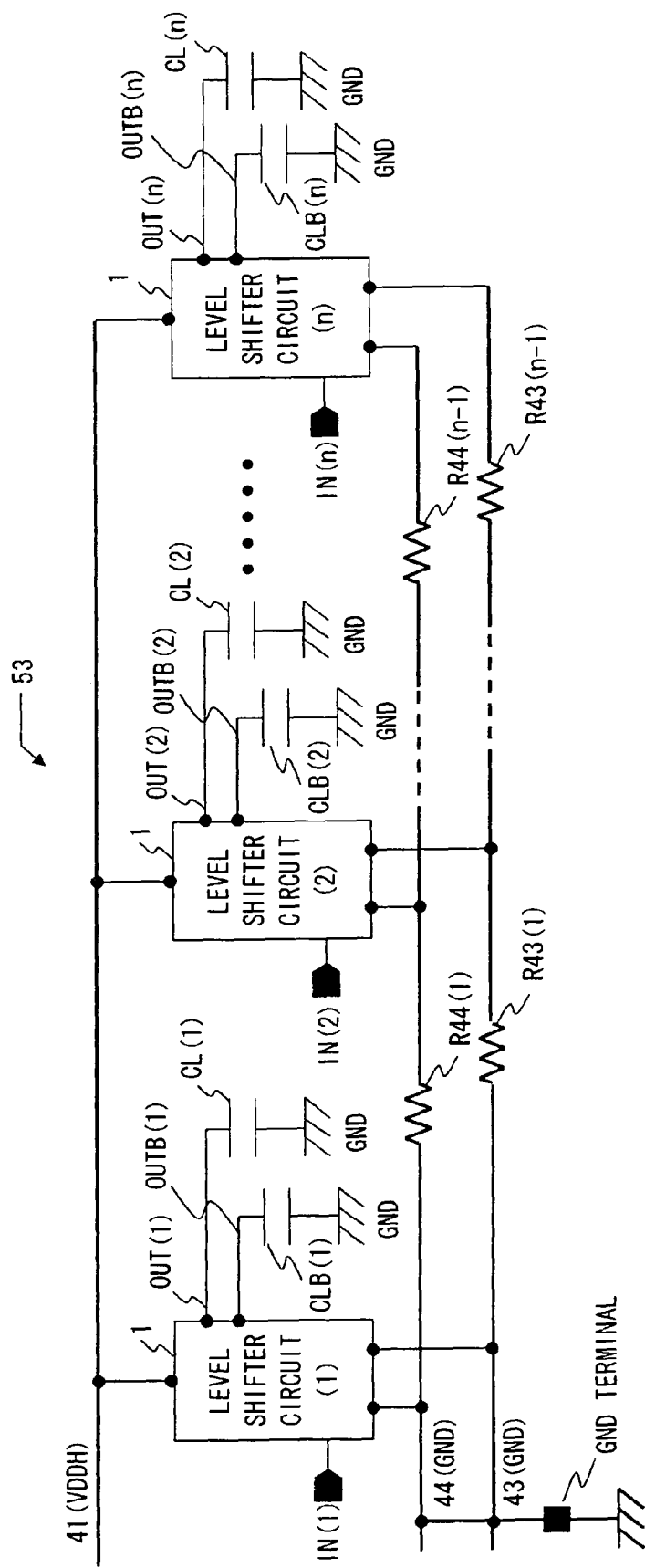
FIG. 4 is a block diagram showing a level shifter circuit group including a plurality of the level shifter circuits according to the first embodiment.

FIG. 4 is a circuit diagram showing a level shifter circuit group 53 in which n level shifter circuits 1 according to this embodiment shown in FIG. 1 are connected in parallel. The level shifter circuit group 53 shown in FIG. 4 includes the level shifter circuit 1 of the number (n) corresponding to the number of outputs and gray-scale levels of the display driver. The input signals IN(1) to IN(n) are respectively supplied to each level shifter circuit 1. The load capacitances CL(1) to CL(n) and the load capacitances CLB(1) to CLB(n) are connected to each level shifter circuit 1. The load capacitances CL(1) to CL(n) and the load capacitances CLB(1) to CLB(n) are gate capacitances and wiring capacitance of the high withstand voltage MOS transistor which is connected to a subsequent stage of each level shifter circuit 1.

Each level shifter circuit 1 is connected to the power supply line 41 of the power supply potential VDDH. The first voltage conversion circuit 11 of each level shifter circuit 1 is connected to the power supply line 44 of the ground potential. The second voltage conversion circuit 12 of each level shifter circuit 1 is connected to the power supply line 43 of the ground potential. The power supply line 43 of the ground potential and the power supply line 44 of the ground potential are separated, and are connected to a GND terminal at the root. The resistors R43(1) to R43(n−1) are wiring resistors which exist in the power supply line 43 of the ground potential, and the resistors R44(1) to R44(n−1) are wiring resistors which exist in the power supply line 44 of the ground potential.

As described above, in the level shifter circuit of this embodiment, the power supply line 44 of the ground potential of the first voltage conversion circuit 11 and the power supply line 43 of the ground potential of the second voltage conversion circuit 12 are separated. Thus by the flow-through current and the discharge current flowing into the power supply line 43 of the ground potential of the second voltage conversion circuit 12, it is possible to suppress from increasing the voltage level of the ground potential of the first voltage conversion circuit 11.

To be specific, when the level shifter circuits 1 operate at the same time at the switching timing of display data, by discharging the flow-through current and load current by the operation of each level shifter circuit, the voltage level of the ground potential (GND) 43 increases according to the wiring resistors R43(1) to R43(n−1) of the power supply line 43 of the ground potential (GND). However, by separating the power supply line 44 of the ground potential of the first voltage conversion circuit 11 and the power supply line 43 of the ground potential of the second voltage conversion circuit 12 at the terminal of the ground potential (GND), it is possible to suppress from reducing the gate-to-source voltage (Vgs).

Accordingly, even when the power supply potential VDDL is low, a stable level shifter operation can be performed. Accordingly, in the level shifter circuit 1 according to this embodiment, a high-speed and stable level shifter operation can be performed even when the logic potential VDDL is low without increasing the gate width of the NMOS transistors 21 and 22, the number of transistors increases, though.

Figure 5:
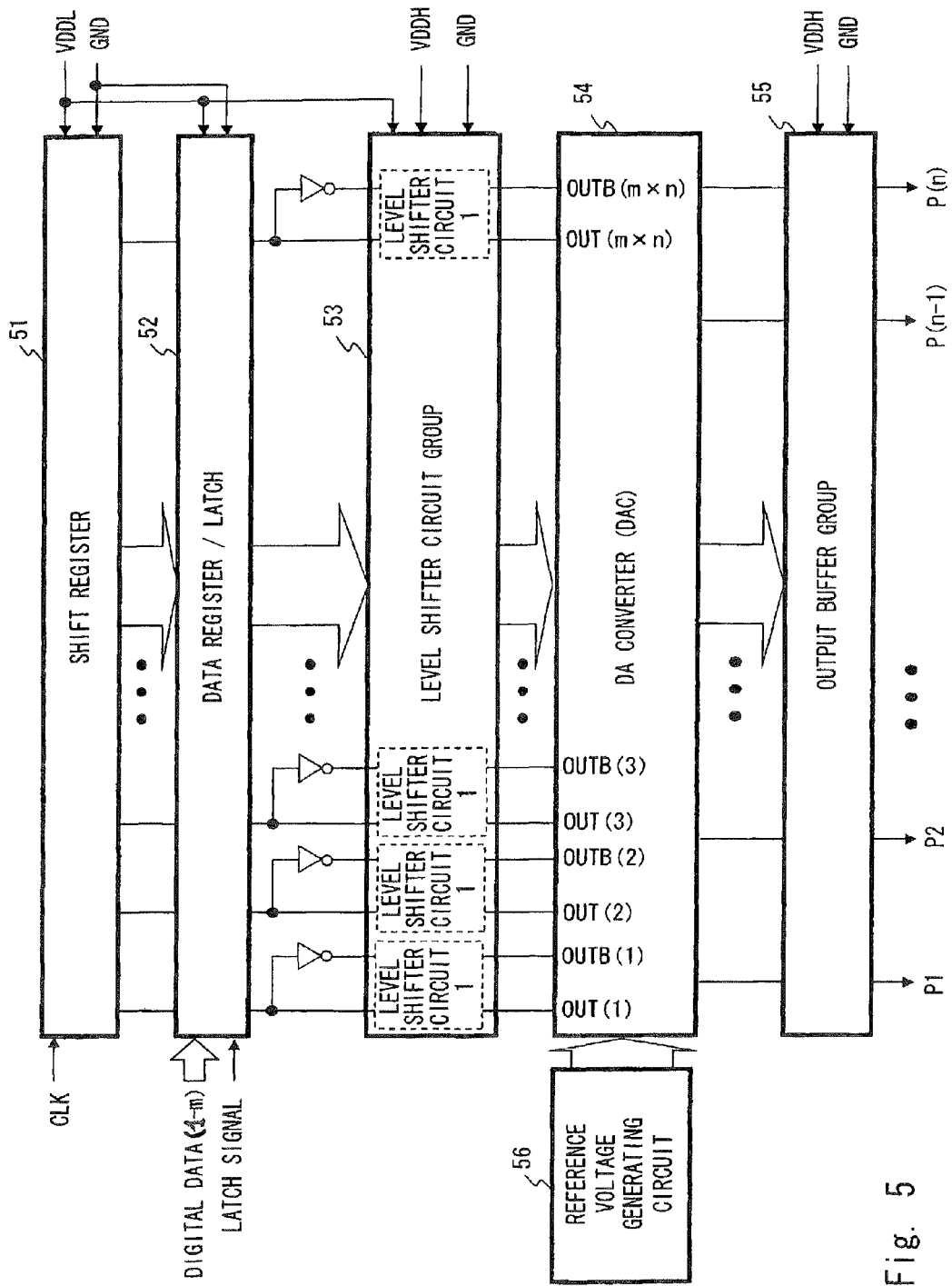
FIG. 5 is a block diagram showing a display driver circuit including the level shifter circuit group according to the first embodiment.

Next, an example of the display driver circuit including the level shifter circuit group 53 according to this embodiment is explained with reference to FIG. 5. The display driver circuit shown in FIG. 5 includes a shift register 51, a data register/latch 52, the level shifter circuit group 53, a DA converter (DAC) 54, an output buffer group 55, and a reference voltage generating circuit 56.

The shift register 51 receives a clock signal CLK, and generates a latch timing signal for selecting a latch address. The data register/latch 52 latches digital data (m bits: 1 to m) according to the latch timing signal output from the shift register 51. The level shifter circuit group 53 includes a plurality of (m×n) level shifter circuits 1 shown in FIG. 1 which receive an output data signal (corresponding to the input signal IN) of each stage of the data register/latch 52 and the inverted output signal, and perform a level shift operation. Each level shifter circuit 1 differentially outputs the output signals OUT(1) to OUT(m×n), and OUTB(1) to OUTB(m×n).

The DA converter (DAC) 54 receives the output signal (video data) of the level shift circuit group 53, and the reference voltages (VL0 to VL (two to the power of m)) with different levels from the reference voltage generating circuit 56, and outputs a gray-scale voltage corresponding to the video data. The output buffer group 55 includes n output buffers (P1 to Pn) which receive the output voltage of the DA converter 54 and drive data lines. The shift register 51 and the data register/latch 52 are driven by the power supply potential VDDL and the power supply potential GND. The level shifter circuit group 53 is driven by the power supply potential VDDH, the power supply potential VDDL, and the power supply potential GND. The DA converter (DAC) 54 and the output buffer group 55 are driven by the power supply potential VDDH and the power supply potential GND.

As explained above, by the level shifter circuit and the driver circuit using thereof according to this embodiment, it is possible to provide a level shifter circuit and a display driver circuit with a fast response speed for the input signal IN.

Second Embodiment

Next, a second embodiment of the present invention is explained. A level shifter circuit according to this embodiment uses a current limiting circuit shown in FIGS. 6A and 6B for the current limiting circuit 34 of the level shifter circuit according to the first embodiment shown in FIG. 1. The other parts are same as the level shifter circuit explained in the first embodiment, thus duplicate explanation is omitted.

Figure 6A:
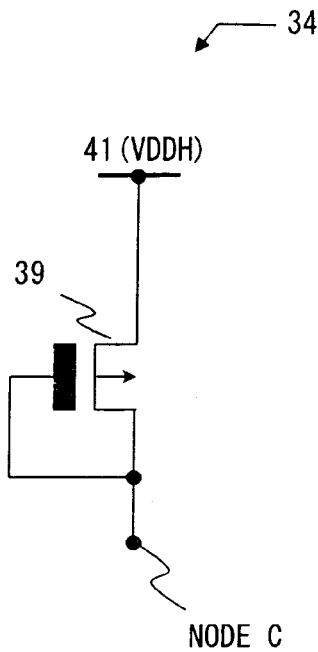
FIG. 6A is a circuit diagram showing an example of the current limiting circuit of the level shifter circuit according to a second embodiment (when using a PMOS transistor)

As for the current limiting circuit 34 shown in FIG. 6A, a PMOS transistor 39 is included, in which the source is connected to the power supply line 41 of the power supply potential VDDH, and the gate and the drain are connected to each other. That is, the PMOS transistor 39 is a diode-connected transistor. The current supplied to the node C can be limited by the current limiting circuit 34 shown in FIG. 6A.

Figure 6B:
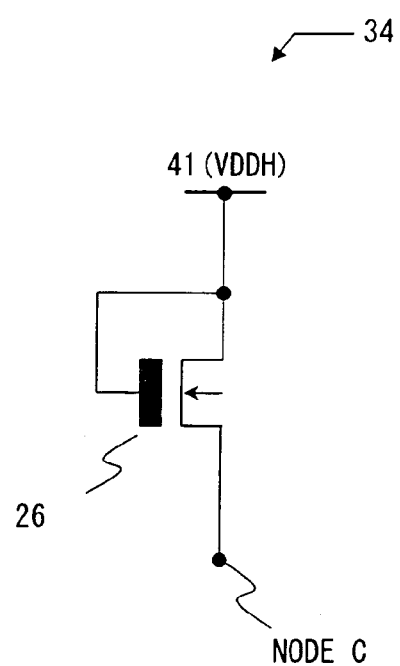
FIG. 6B is a circuit diagram showing an example of the current limiting circuit of the level shifter circuit according to the second embodiment (when using an NMOS transistor)

The current limiting circuit 34 shown in FIG. 6B includes an NMOS transistor 26. As for the NMOS transistor 26, the drain is connected to the power supply line 41 of the power supply potential VDDH and the gate, and the source is connected to the node C. That is, the NMOS transistor 26 is a diode-connected transistor. The current supplied to the node C can be limited by the current limiting circuit 34 shown in FIG. 6B.

Figure 7:
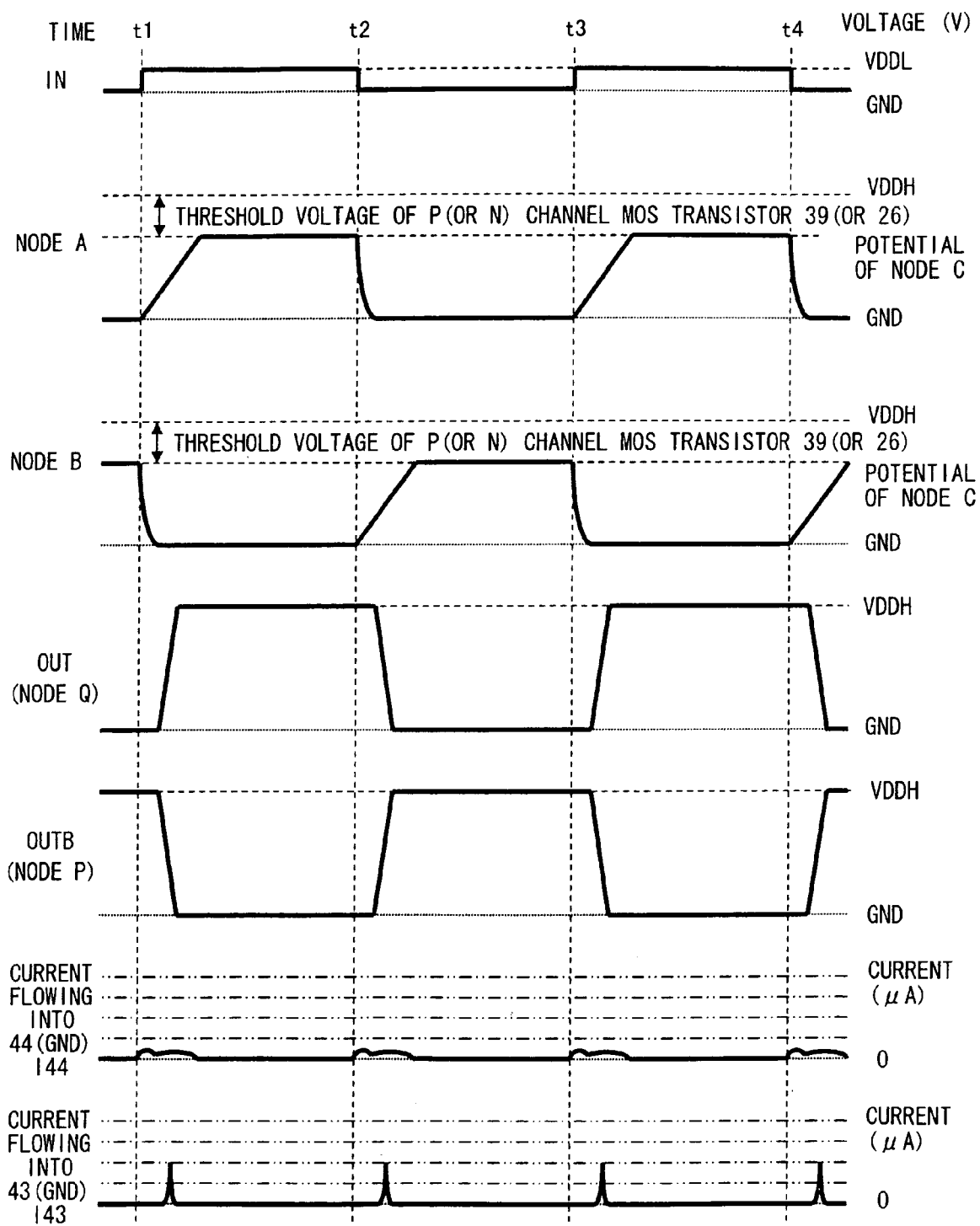
FIG. 7 is a timing chart for explaining an operation of the level shifter circuit according to the second embodiment.

FIG. 7 is a timing chart for explaining an operation of the level shifter circuit according to this embodiment. In the level shifter circuit according to this embodiment, the current limiting circuit shown in FIG. 6A or 6B is used. Accordingly, the maximum potential of the nodes A and B will be a potential (potential of the node C) obtained by subtracting a threshold voltage of the PMOS transistor 39 shown in FIG. 6A from the power supply potential VDDH. Similarly, the maximum potential of the nodes A and B will be a potential (potential of the node C) obtained by subtracting a threshold voltage of the NMOS transistor 26 shown in FIG. 6B from the power supply potential VDDH. The other parts are same as the operation explained in the first embodiment, thus duplicate explanation is omitted.

By the level shifter circuit and the driver circuit using thereof according to this embodiment, it is possible to provide a level shifter circuit and a display driver circuit with a fast response speed for the input signal IN without increasing the circuit size.

Third Embodiment

Next, a third embodiment of the present invention is explained.

Figure 8:
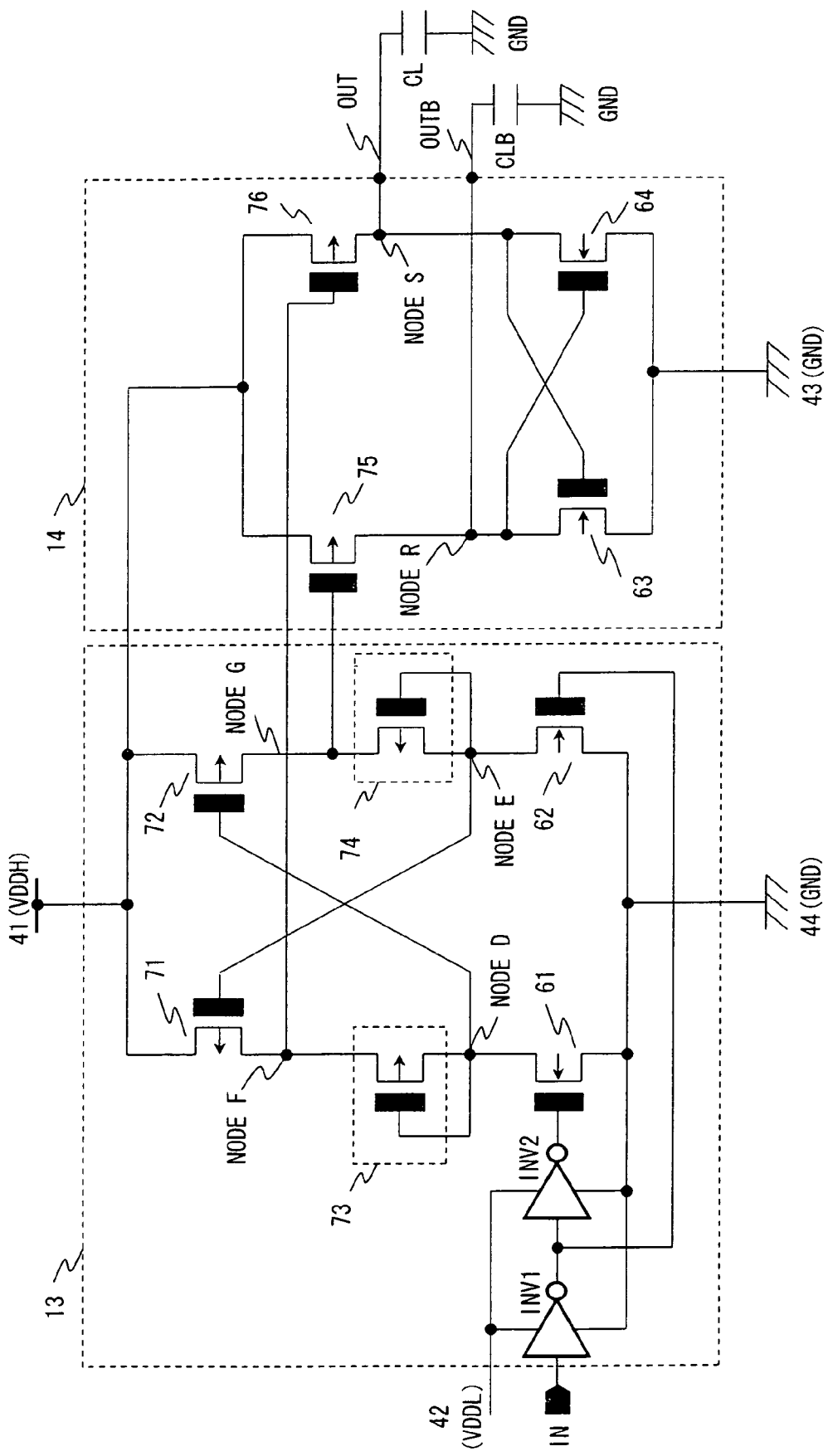
FIG. 8 is a circuit diagram showing a level shifter circuit according to a third embodiment.

FIG. 8 is a circuit diagram showing a level shifter circuit according to the third embodiment. The level shifter circuit according to this embodiment includes a first voltage conversion circuit 13 and a second voltage conversion circuit 14. The level shifter circuit according to the third embodiment differs from the level shifter circuit explained in the first embodiment in the circuit configuration of the first voltage conversion circuit 13 and the second voltage conversion circuit 14. Hereinafter, the level shifter circuit according to this embodiment is explained in detail.

The first voltage conversion circuit 13 includes inverter circuits INV1 and INV2, an NMOS transistor 61 (a fifth N-channel MOS transistor), an NMOS transistor 62 (a sixth N-channel MOS transistor), a PMOS transistor 71 (a seventh P-channel MOS transistor), a PMOS transistor 72 (an eighth P-channel MOS transistor), a PMOS transistor 73 (a fifth P-channel MOS transistor), and a PMOS transistor 74 (a sixth P-channel MOS transistor). The PMOS transistors 73 and 74 compose a current limiting circuit.

The inverter circuit INV1 receives the input signal IN, inverts the input signal IN, and outputs the inverted signal to the gate of the NMOS transistor 62, and the inverter circuit INV2. The inverter circuit INV2 receives the inverted input signal IN, inverts this signal (which will be a signal that is in phase with the input signal IN), and outputs this inverted signal to the gate of the NMOS transistor 61. The power supply potential VDDL (the second power supply potential) is respectively supplied to the inverter circuits INV1 and INV2. The inverter circuits INV1 and INV2 are connected to the power supply line 44 of the ground potential (the first power supply potential).

Note that also in this embodiment, the relationship between each power supply potential is; the ground potential (the first power supply potential)<the power supply potential VDDL (the second power supply potential)<the power supply potential VDDH (the third power supply potential).

The input signal IN has an amplitude ranging between the ground potential and the power supply potential VDDL, which is higher than the ground potential.

The gate of the NMOS transistor 61 is connected to the output of the inverter circuit INV2, and supplied with the non-inverted signal of the input signal. Further, the source is connected to the power supply line 44 of the ground potential, and the drain is connected to a node D (a fifth node). The gate of the NMOS transistor 62 is connected to the output of the inverter circuit INV1, and supplied with an inversion signal of the input signal. The source is connected to the power supply line 44 of the ground potential, and the drain is connected to a node E (a sixth node).

The source of the PMOS transistor 73 is connected to a node F (a seventh node), and the gate and the drain are connected to the node D. The source of the PMOS transistor 74 is connected to a node G (an eighth node), and the gate and the drain are connected to the node E. The gate of the PMOS transistor 71 is connected to the node E, the source is connected to the power supply line 41 of the power supply potential VDDH, and the drain is connected to a node F. The gate of the PMOS transistor 72 is connected to the node D, the source is connected to the power supply line 41 of the power supply potential VDDH, and the drain is connected to the node G. A voltage signal output from the nodes F and G is a voltage signal output according to the input signal IN, and has a larger amplitude than that of the input signal IN.

The second voltage conversion circuit 14 includes an NMOS transistor 63 (a seventh N-channel MOS transistor), an NMOS transistor 64 (an eighth N-channel MOS transistor), a PMOS transistor 75 (a ninth P-channel MOS transistor), and a PMOS transistor 76 (a tenth P-channel MOS transistor).

The gate of the NMOS transistor 63 is connected to a node S (a tenth node), the source is connected to the power supply line 43 of the ground potential, and the drain is connected to a node R (a ninth node). The gate of the NMOS transistor 64 is connected to a node R, the source is connected to the power supply line 43 of the ground potential, and the drain is connected to the node S.

The gate of the PMOS transistor 75 is connected to the node G, the source is connected to the power supply line 41 of the power supply potential VDDH, and the drain is connected to the node R. The gate of the PMOS transistor 76 is connected to the node F, the source is connected to the power supply line 41 of the power supply potential VDDH, and the drain is connected to the node S.

Then, in the level shifter circuit according to this embodiment, the output signals OUT and OUTB according to the input signal IN, which are the input signal IN with an amplitude amplified between the ground potential and the power supply potential VDDH, are output from the nodes S and R. Then, the output signals OUT and OUTB which are output from the nodes S and R are respectively supplied to the load capacitances CL and CLB. The load capacitances CL and CLB are gate capacitances and wiring capacitances of a high withstand voltage MOS transistor which is connected to a subsequent stage, for example.

In the level shifter circuit according to this embodiment, the NMOS transistors 61, 62, 63, and 64 and the PMOS transistors 71, 72, 73, 74, 75, and 76 are high withstand voltage transistors which can withstand a voltage of about 20 V, for example. Moreover, the power supply potential VDDL can be about 1.5 V, for example, and the power supply potential VDDH can be about 20 V.

The PMOS transistors 73 and 74 are current limiting circuits, and the PMOS transistors 73 and 74 are so-called diode-connected transistors. Accordingly, the first voltage conversion circuit 13 can limit the node D and the current supplied to the node D.

Figure 9:
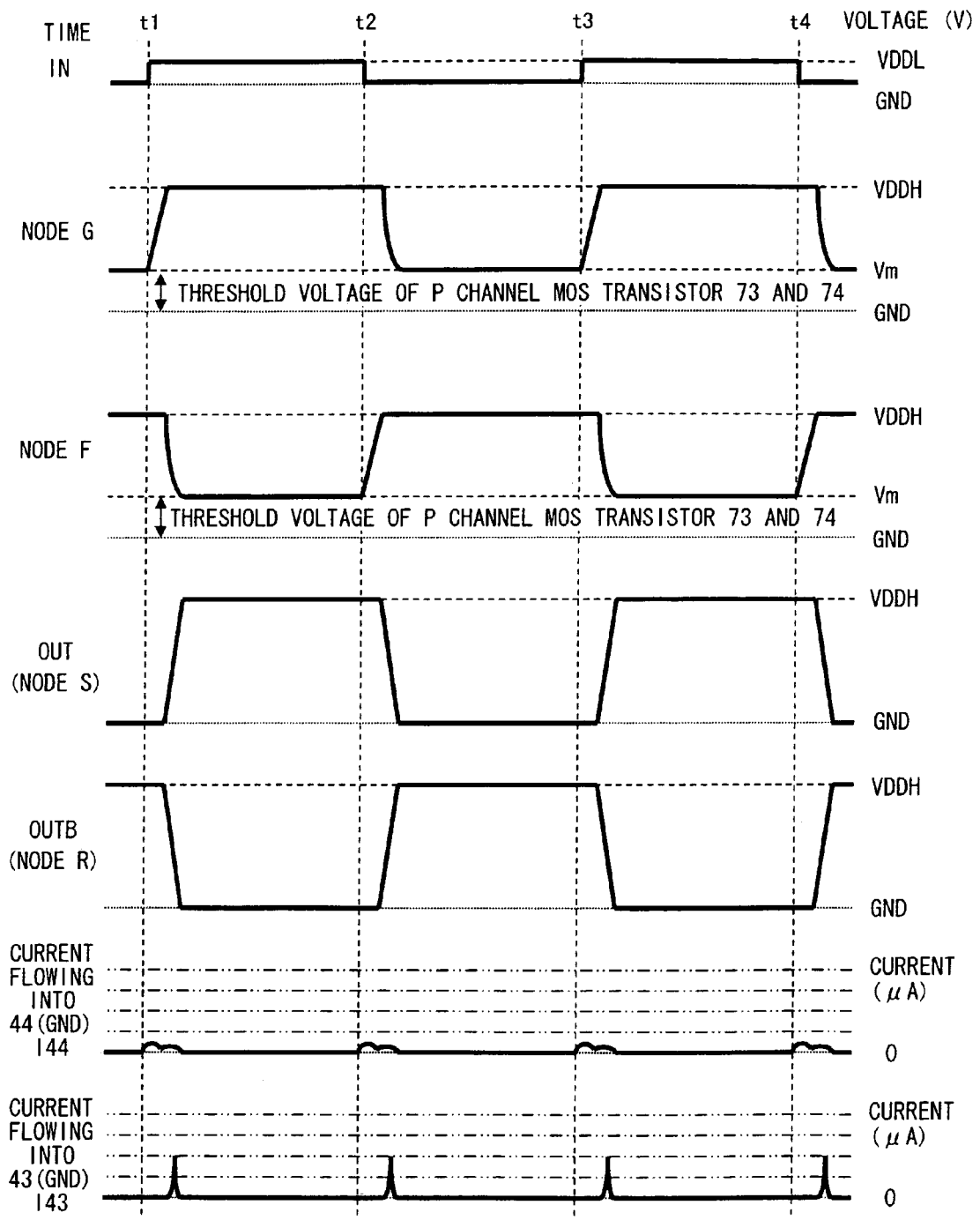
FIG. 9 is a timing chart for explaining an operation of the level shifter circuit according to the third embodiment.
Figure 10:
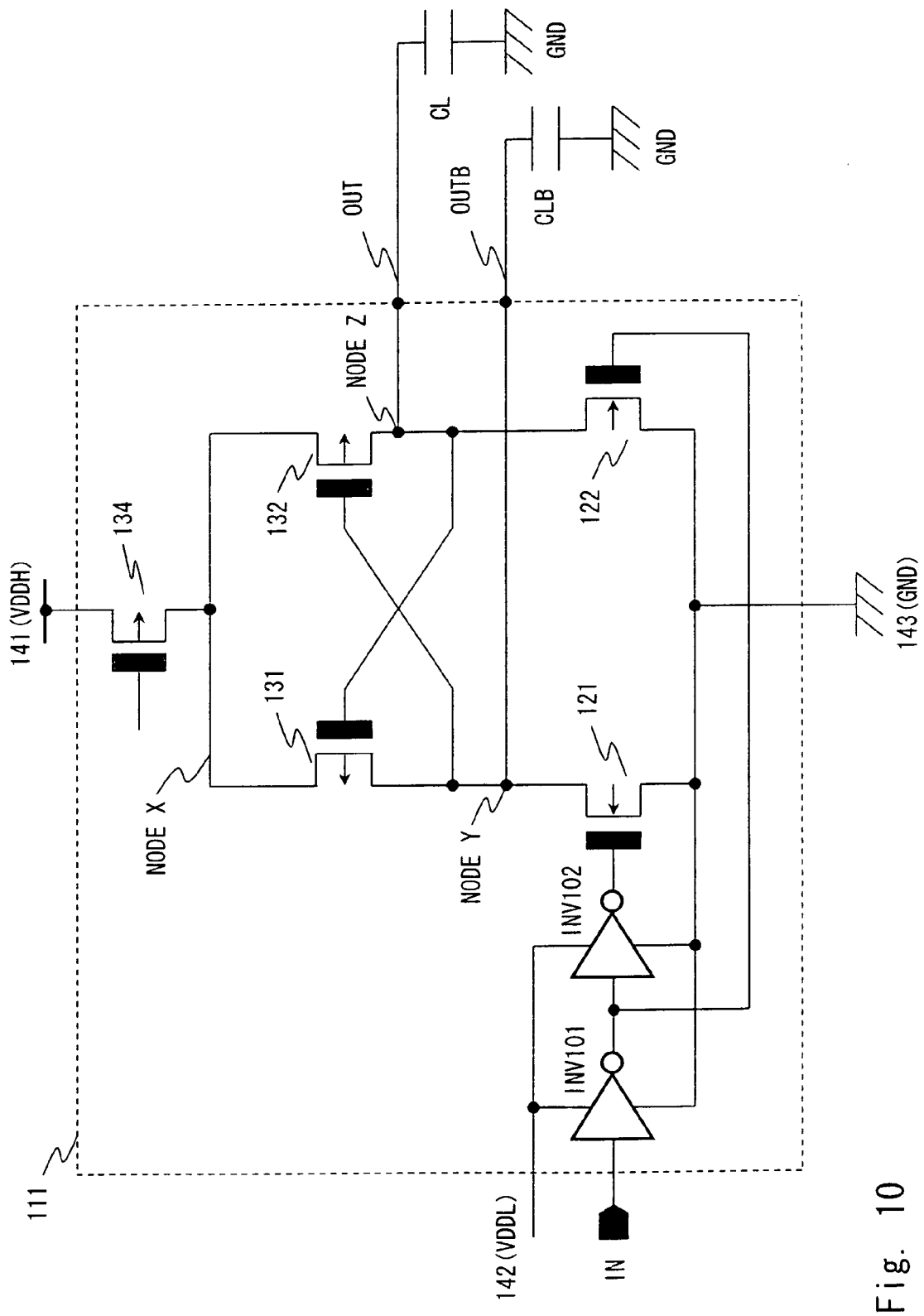
FIG. 10 is a circuit diagram showing an example of the level shifter circuit.

Next, an operation of the level shifter circuit according to this embodiment is explained with reference to the timing chart shown in FIG. 9.

The input signal IN input to the first voltage conversion circuit 11 will be high level (VDDL) at the timing t1. Then, the gate of the NMOS transistor 61 will be high level (VDDL), and the NMOS transistor 61 will be in ON state. The gate of the NMOS transistor 62 will be low level (GND), and the NMOS transistor 62 will be in OFF state.

As the node E is low level (GND) immediately before the timing t1, the PMOS transistor 71 is in ON state. Therefore, the node F is connected to the power supply line 41 of the power supply potential VDDH. Accordingly, when the NMOS transistor 61 is in ON state, the node D is connected to the power supply line 44 of the ground potential, and the potential of the node D gradually decreases. Thus, the gate potential of the PMOS transistor 72 gradually decreases, and the PMOS transistor 72 gradually turns on. Since the NMOS transistor 62 is in OFF state at this time, the potentials of the nodes E and G gradually increase. When the potentials of the nodes E and G gradually increase, the PMOS transistor 71 gradually turns off, thus the potentials of the nodes D and F decrease.

In order to complete the level shift operation at this time, the on-resistance obtained by combining the PMOS transistors 71 and 73, which are connected in series, is made higher than the on-resistance of the NMOS transistor 61. Then, the node D will eventually be the ground potential (GND), and the node F will be a potential (potential Vm) higher than the ground potential by a threshold voltage of the PMOS transistor 73. When the node D is the ground potential (GND), the gate of the PMOS transistor 72 will also be the ground potential (GND), and the PMOS transistor 72 will be in ON state. Accordingly, the node G is connected to the power supply line 41 of the power supply voltage VDDH, and the node G will be high level (VDDH). When the node G is high level (VDDH), the node E will also be high level (VDDH-VtP). VtP is a threshold voltage of the PMOS transistors 71, 72, 73, and 74. Then, the gate of the PMOS transistor 71 will be high level (VDDH-VtP), and the PMOS transistor 71 will be in OFF state.

In this embodiment, the PMOS transistor 73 which functions as a current limiting circuit is provided between the PMOS transistor 71 and the NMOS transistor 61. Further, the PMOS transistor 74 which functions as a current limiting circuit is provided between the PMOS transistor 72 and the NMOS transistor 62. Accordingly, since the node G is located upstream of the PMOS transistor 74, the rising edge of the voltage of the node G will be faster. As the gate potential of the PMOS transistor 71 increases after the rising edge of the voltage of the node G, the falling edge of the voltage of the node F, which performs complementary inverting operation, delays at this time.

The node G is connected to the gate of the PMOS transistor 75 of the second voltage conversion circuit 14. Accordingly, when the voltage of the node G is high level (VDDH), the PMOS transistor 75 will be in OFF state. The node F is connected to the gate of the PMOS transistor 76. Accordingly, when the potential of the node F is the potential Vm, the PMOS transistor 76 will be in ON state. Note that from the above reason, the falling edge of the voltage of the node F delays relative to the rising edge the voltage of the node G. Accordingly, after the PMOS transistor 75 is in OFF state, the PMOS transistor 76 will be in ON state.

As the node R is high level immediately before the timing t1, the NMOS transistor 64 is in ON state. Therefore, the node S is connected to the power supply line 43 of the ground potential. Then, when the PMOS transistor 76 is in ON state, the node S is connected to the power supply line 41 of the power supply potential VDDH, and the potential of the node S gradually increase. Accordingly, the gate potential of the NMOS transistor 63 gradually increases, and the NMOS transistor 63 gradually turns on. Since the PMOS transistor 75 is already in OFF state at this time, the potential of the node R gradually decreases when the potential of the node R gradually decreases, the NMOS transistor 64 gradually turns off, thus the potential of the node S increases.

In order to complete the level shift operation at this time, the on-resistance of the PMOS transistor 76 is made lower than the on-resistance of the NMOS transistor 64. Then, the node S will eventually be high level (VDDH). When the node S is high level (VDDH), the gate of the NMOS transistor 63 will be high level (VDDH), and the NMOS transistor 63 will be in ON state. Accordingly, the node R is connected to the power supply line 43 of the ground potential. Since the PMOS transistor 75 is in OFF state, a low level (GND) signal is output as the output signal OUTB. When the node R is low level, the NMOS transistor 64 will be in OFF state, thus a high level (VDDH) signal is output as the output signal OUT from the node S.

At this time, since the second voltage conversion circuit 14 operates so that the PMOS transistors 75 and 76 will not turn on at the same time, it is possible to suppress the flow-through current flowing into the PMOS transistor 75 and the NMOS transistor 63, and the flow-through current flowing into the PMOS transistor 76 and the NMOS transistor 64. Note that although a low level potential of the nodes F and G of the first voltage conversion circuit 13 will be the potential Vm and does not reach the ground potential, there is no problem as the low level potential is amplified by the second voltage conversion circuit 14 to a voltage amplitude ranging between the ground potential (GND) and the power supply potential VDDH.

The input signal IN input to the first voltage conversion circuit 11 will be low level (GND) at the timing t2. Accordingly, the gate of the NMOS transistor 62 will be high level (VDDL), and the NMOS transistor 62 will be in ON state. The gate of the NMOS transistor 61 will be low level (GND), and the NMOS transistor 61 will be in OFF state.

As the node D is low level (GND) immediately before the timing t2, the PMOS transistor 72 is in ON state. Therefore, the node G is connected to the power supply line 41 of the power supply potential VDDH. Thus, when the NMOS transistor 62 is in ON state, the node E is connected to the power supply line 44 of the ground potential, and the potential of the node E gradually decreases. Then, the gate potential of the PMOS transistor 71 gradually decreases, and the PMOS transistor 71 gradually turns on. Since the NMOS transistor 61 is in OFF state at this time, the potentials of the nodes D and F gradually increase. When the potentials of the nodes D and F gradually increase, the PMOS transistor 72 gradually turns off, thus the potential of the nodes E and G decreases.

In order to complete the level shift operation at this time, the on-resistance obtained by combining the PMOS transistors 72 and 74, which are connected in series, is made higher than the on-resistance of the NMOS transistor 62. Then, the node E will eventually be the ground potential (GND), and the node G will be a potential (potential Vm) higher than the ground potential by the threshold voltage of the PMOS transistor 74. When the node E is the ground potential (GND), the gate of the PMOS transistor 71 will also be the ground potential (GND), and the PMOS transistor 71 will be in ON state. Accordingly, the node F is connected to the power supply line 41 of the power supply voltage VDDH, and the node F will be high level (VDDH). When the node F is high level (VDDH), the node D will be high level (VDDH-VtP). Then, the gate of the PMOS transistor 72 will also be high level (VDDH-VtP), and the PMOS transistor 72 will be in OFF state.

In this embodiment, the PMOS transistor 73 which functions as a current limiting circuit is provided between the PMOS transistor 71 and the NMOS transistor 61. Further, the PMOS transistor 74 which functions as a current limiting circuit is provided between the PMOS transistor 72 and the NMOS transistor 62. Thus, since the node F is located upstream of the PMOS transistor 73, the rising edge of the voltage F will be faster. As the gate potential of the PMOS transistor 72 increases after the rising edge of the voltage of the node F, the falling edge of the voltage of the node G, which performs complementary inverting operation, delays at this time.

The node F is connected to the gate of the PMOS transistor 76 of the second voltage conversion circuit 14. Accordingly, when the voltage of the node F is high level (VDDH), the PMOS transistor 76 will be in OFF state. The node G is connected to the gate of the PMOS transistor 75. Thus, when the potential of the node G becomes potential Vm, the PMOS transistor 75 will be in ON state. Note that by the above reason, the falling edge of the voltage of the node G delays relative to the rising edge of the voltage of the node F. Accordingly, after the PMOS transistor 76 is in OFF state, the PMOS transistor 75 will be in ON state.

As the node S is high level immediately before the timing t2, the NMOS transistor 63 is in ON state. Therefore, the node R is connected to the power supply line 43 of the ground potential. Then, when the PMOS transistor 75 will be in ON state, the node R is connected to the power supply line 41 of the power supply potential VDDH, and the potential of the node R gradually increases. Accordingly, the gate potential of the NMOS transistor 64 gradually increases, and the NMOS transistor 64 gradually turns on. Since the PMOS transistor 76 is already in OFF state at this time, the potential of the node S gradually decreases. When the potential of the node S gradually decreases, the NMOS transistor 63 gradually turns off, thus the potential of the node R increases.

In order to complete the level shift operation at this time, the on-resistance of the PMOS transistor 75 is made lower than the on-resistance of the NMOS transistor 63. Then, the node R will eventually be high level (VDDH). When the node R is high level (VDDH), the gate of the NMOS transistor 64 will also be high level (VDDH), and the NMOS transistor 64 will be in ON state. Accordingly, the node S is connected to the power supply line 43 of the ground potential. Since the PMOS transistor 76 is in OFF state, a low level (GND) signal is output as the output signal OUT. When the node S is low level (GND), the NMOS transistor 63 will be in OFF state, thus a high level (VDDH) signal is output from the node R as the output signal OUTB.

At this time, since the second voltage conversion circuit 14 operates so that the PMOS transistors 75 and 76 will not turn on at the same time, it is possible to suppress the flow-through current flowing into the PMOS transistor 75 and the NMOS transistor 63, and the flow-through current flowing into the PMOS transistor 76 and the NMOS transistor 64. Note that although a low level potential of the nodes F and G of the first voltage conversion circuit 13 will be the potential Vm and does not reach the ground potential, there is no problem as the low level potential is amplified by the second voltage conversion circuit 14 to a voltage amplitude ranging between the ground potential (GND) and the power supply potential VDDH.

Note that the operation at the timing t3 is same the operation at the timing t1, and the operation at the timing t4 is the same as the operation at the timing t2.

In the level shifter circuit according to this embodiment, the power supply line 44 (the first line) of the ground potential of the first voltage conversion circuit 13 and the power supply line (the second line) 43 of the ground potential of the second voltage conversion circuit 14 are separated in a similar way as the case of first embodiment. Accordingly, by the flow-through current and the discharge current flowing into the power supply line 43 of the ground potential of the second voltage conversion circuit 12, it is possible to suppress from increasing the voltage level of the ground potential of the first voltage conversion circuit 11.

The similar advantage as the level shifter circuit explained in the first embodiment can be obtained also in the level shifter circuit according to this embodiment, thus detailed explanation is omitted. As with the level shifter circuit according to the first embodiment, the level shifter circuit according to this embodiment can be used to a display driver circuit.

The first to the third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A level shifter circuit comprising:
   a first voltage conversion circuit that receives an input signal with an amplitude ranging between a first power supply potential and a second power supply potential which is higher than the first power supply potential, and outputs a voltage signal having an amplitude larger than that of the input signal according to the input signal, the first voltage conversion circuit including a current limiting circuit that limits a current supplied from a power supply line of a third power supply potential which is higher than the second power supply potential; and
   a second voltage conversion circuit that is supplied with the third power supply potential and outputs an output signal having an amplitude ranging between the first power supply potential and the third power supply potential according to the voltage signal.

2. The level shifter circuit according to claim 1, wherein the voltage signal has an amplitude ranging between the first power supply potential and the third power supply potential.

3. The level shifter circuit according to claim 2, wherein the current limiting circuit comprises a P-channel MOS transistor with a source being connected to the power supply line of the third power supply potential and a gate being supplied with a control signal, and
   a drain of the P-channel MOS transistor supplies the first voltage conversion circuit with a current according to the control signal.

4. The level shifter circuit according to claim 1, wherein a first line, which comprises a power supply line of the first power supply potential of the first voltage conversion circuit, and a second line, which comprises a power supply line of the first power supply potential of the second voltage conversion circuit, are separated.

5. The level shifter circuit according to claim 4, wherein the voltage signal has an amplitude ranging between the first power supply potential and the third power supply potential.

6. The level shifter circuit according to claim 5, wherein
   the current limiting circuit comprises a P-channel MOS transistor with a source being connected to the power supply line of the third power supply potential and a gate being supplied with the control signal, and
   a drain of the P-channel MOS transistor supplies the first voltage conversion circuit with a current according to the control signal.

7. The level shifter circuit according to claim 4, wherein the voltage signal has an amplitude ranging between the first power supply potential and a voltage, which is greater than the second power supply potential and less than the third power supply potential.

8. The level shifter circuit according to claim 7, wherein the current limiting circuit comprises a P-channel MOS transistor with a source being connected to the power supply line of the third power supply potential and a gate and a drain connected to each other.

9. The level shifter circuit according to claim 7, wherein the current limiting circuit comprises an N-channel MOS transistor with a drain being connected to a gate and the power supply line of the third power supply potential.

10. The level shifter circuit according to claim 1, wherein the voltage signal has an amplitude ranging between the first power supply potential and a voltage, which is greater than the second power supply potential and less than the third power supply potential.

11. The level shifter circuit according to claim 10, wherein the current limiting circuit comprises a P-channel MOS transistor with a source being connected to the power supply line of the third power supply potential and a gate and a drain being connected to each other.

12. The level shifter circuit according to claim 10, wherein the current limiting circuit comprises an N-channel MOS transistor with a drain being connected to a gate and the power supply line of the third power supply potential.

13. The level shifter circuit according to claim 1, wherein the first voltage conversion circuit comprises:
   a first N-channel MOS transistor with a gate being supplied with a non-inverted signal of the input signal, a source being connected to the power supply line of the first power supply potential, and a drain being connected to a first node;
   a second N-channel MOS transistor with a gate being supplied with an inverted signal of the input signal, a source being connected to the power supply line of the first power supply potential, and a drain being connected to a second node;
   a first P-channel MOS transistor with a gate being connected to the second node, a source being connected to the power supply line of the third power supply potential via the current limiting circuit, and a drain being connected to the first node; and a second P-channel MOS transistor with a gate being connected to the first node, a source being connected to the power supply line of the third power supply potential, and a drain being connected to the second node.

14. The level shifter circuit according to claim 13, wherein the second voltage conversion circuit comprises:
a third N-channel MOS transistor with a gate being connected to the second node, a source being connected to the power supply line of the first power supply potential, and a drain being connected to a third node;
a fourth N-channel MOS transistor with a gate being connected to the first node, a source being connected to the power supply line of the first power supply potential, and a drain being connected to a fourth node;
a third P-channel MOS transistor with a gate being connected to the fourth node, a source being connected to the power supply line of the third power supply potential, and a drain being connected to the third node; and
a fourth P-channel MOS transistor with a gate being connected to the third node, a source being connected to the power supply line of the third power supply potential, and a drain being connected to the fourth node,
wherein the output signal according to the input signal is output from the third node and the fourth node.

15. The level shifter circuit according to claim 1, wherein the first voltage conversion circuit comprises:
a first N channel MOS transistor with a gate being supplied with a non-inverted signal of the input signal, a source being connected to the power supply line of the first power supply potential, and a drain being connected to a first node;
a second N channel MOS transistor with a gate being supplied with an inverted signal of the input signal, a source being connected to the power supply line of the first power supply potential, and a drain being connected to a second node;
a first P-channel MOS transistor with a gate and a drain being connected to the fifth node, and a source being connected to a third node;
a second P-channel MOS transistor with a gate and a drain being connected to the sixth node, and a source being connected to a fourth node;
a third P channel MOS transistor with a gate being connected to the second node, a source being connected to the power supply line of the third power supply potential, and a drain being connected to the third node; and
a fourth P-channel MOS transistor with a gate being connected to the first node, a source being connected to the power supply line of the third power supply potential, and a drain being connected to the fourth node.

16. The level shifter circuit according to claim 15, comprising:
a third N channel MOS transistor with a gate being connected to a sixth node, a source being connected to the power supply line of the first power supply potential, and a drain being connected to a fifth node;
a fourth N-channel MOS transistor with a gate being connected to the fifth node, a source being connected to the power supply line of the first power supply potential, and a drain being connected to the sixth node;
a fifth P channel MOS transistor with a gate being connected to the fourth node, a source being connected to the power supply line of the third power supply potential, and a drain being connected to the fifth node; and
a sixth P channel MOS transistor with a gate being connected to the third node, a source being connected to the power supply line of the third power supply potential, and a drain being connected to the sixth node,
wherein the output signal according to the input signal is output from the fifth node and the sixth node.

17. A display driver circuit including a level shifter circuit group having n of the level shifter circuit according to claim 1, the display driver comprising:
a first line that supplies the first power supply potential to each of the first voltage conversion circuit included in the n level shifter circuit group;
a second line that supplies the first power supply potential to each of the second voltage conversion circuit included in the n level shifter circuit group; and
a power supply line that supplies the third power supply potential to each of the n level shifter circuit group,
wherein each of the n level shifter circuit group outputs n output signals according to n input signals.

18. The display driver circuit according to claim 17, wherein the first line and the second line are separated at a terminal of the first power supply potential.

19. The level shifter circuit according to claim 1, wherein the current limiting circuit comprises a P-channel MOS transistor with a source being connected to the power supply line of the third power supply potential and a gate being supplied with a control signal.

20. The level shifter circuit according to claim 19, wherein a drain of the P-channel MOS transistor supplies the first voltage conversion circuit with a current according to the control signal.

* * * * *